(12) United States Patent  
Moon et al.

(10) Patent No.: US 9,136,798 B2  
(45) Date of Patent: Sep. 15, 2015

(54) METHOD AND APPARATUS FOR OUTPUTTING AUDIO SIGNAL

(71) Applicant: SAMSUNG ELECTRONICS CO., LTD., Suwon-si (KR)

(72) Inventors: Won-hyung Moon, Seoul (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 319 days.

(21) Appl. No.: 13/653,900

(22) Filed: Oct. 17, 2012

(65) Prior Publication Data

US 2013/0094673 A1  Apr. 18, 2013

(30) Foreign Application Priority Data

Oct. 17, 2011  (KR) .................. 10-2011-0105974

(51) Int. Cl.
*H03F 5/00* (2006.01)
*H03F 3/185* (2006.01)
*H03F 1/32* (2006.01)
*H03F 3/217* (2006.01)

(52) U.S. Cl.
CPC ................ *H03F 3/185* (2013.01); *H03F 1/327* (2013.01); *H03F 3/217* (2013.01); *H03F 5/00* (2013.01)

(58) Field of Classification Search
CPC .................................... H03F 5/00; H03F 1/327
USPC ........ 381/96, 111, 116, 117, 120, 121; 330/3, 330/119
See application file for complete search history.

(56) References Cited

U.S. PATENT DOCUMENTS

| 4,949,048 | A | 8/1990 | Tokumo et al. |
| 4,952,884 | A | 8/1990 | Tokumo et al. |
| 6,140,870 | A * | 10/2000 | Cook ............................. 330/3 |
| 6,297,692 | B1 | 10/2001 | Nielsen |
| 2004/0125968 | A1 | 7/2004 | Pearce et al. |
| 2009/0027120 | A1 | 1/2009 | May |
| 2010/0013554 | A1 * | 1/2010 | Park .............................. 330/10 |
| 2010/0260342 | A1 | 10/2010 | Strub |

(Continued)

FOREIGN PATENT DOCUMENTS

| EP | 1 788 701 A1 | 5/2007 | |
| WO | 03/067753 A1 | 8/2003 | |
| WO | WO 03067753 A1 * | 8/2003 | ............. H03F 3/217 |

OTHER PUBLICATIONS

International Search Report (PCT/ISA/210), dated Feb. 27, 2013, issued by the International Searching Authority in counterpart International Patent Application No. PCT/KR2012/008461.

(Continued)

*Primary Examiner* — Brian Ensey
*Assistant Examiner* — Julie X Dang
(74) *Attorney, Agent, or Firm* — Sughrue Mion, PLLC (57) ABSTRACT

An apparatus for outputting an audio signal with improved sound quality is provided. The apparatus includes a modulation and amplification unit for pulse modulation and switching amplification of an input audio signal and generating an amplified signal which corresponds to the input audio signal; and a vacuum tube amplification unit for inputting a vacuum tube signal generated by attenuating the amplified signal and adding harmonics of a vacuum tube to the amplified signal, to the modulation and amplification unit to provide a mellow sound.

22 Claims, 8 Drawing Sheets

(56) References Cited

U.S. PATENT DOCUMENTS

2011/0043278 A1\* 2/2011 Adams ............................ 330/69
2011/0075359 A1 3/2011 Field et al.

OTHER PUBLICATIONS

Written Opinion (PCT/ISA/237), dated Feb. 27, 2013, issued by the International Searching Authority in counterpart International Patent Application No. PCT/KR2012/008461.

Ampeg: "Owner's Manual—SVT-7 PRO Bass Guitar Amplifier 2 SVT-7 PRO Bass Guitar Amplifier", Sep. 30, 2009, XP055193555, 12 pgs. total.
Jirasereeamornkul, Kamon, et al.: "Vacuum Tube Amplifiers using Electronic DC Transformers," Audio Engineering Society Convention 129; Nov. 4, 2010, San Francisco, California, United States of America, XP040567198, 8 pgs. total.
Communication from the European Patent Office, dated Jun. 15, 2015 in counterpart European Patent Application No. 12842474.4.

\* cited by examiner

METHOD AND APPARATUS FOR OUTPUTTING AUDIO SIGNAL

CROSS-REFERENCE TO RELATED PATENT APPLICATION

This application claims the benefit of Korean Patent Application No. 10-2011-0105974, filed on Oct. 17, 2011, in the Korean Intellectual Property Office, the disclosure of which is incorporated herein in its entirety by reference.

BACKGROUND

1. Field

The present inventive concept relates to a method and apparatus for outputting an audio signal. More particularly, the inventive concept relates to a method and apparatus for outputting an audio signal, whereby sound quality of the audio signal may be improved. The present inventive concept also relates to a method and apparatus for outputting an audio signal, whereby noise and errors that may occur during a switching amplification operation may be reduced.

2. Description of the Related Art

Class A, Class B, Class AB, and Class D amplifiers are used as audio power amplifiers that may output signals that may be recognized auditorily in response to audio signals. From among these amplifiers, the Class D amplifier is widely used because it reduces amplification efficiency degradation that occurs in the A-grade amplifier, the Class B amplifier, and the Class AB amplifier.

The Class D amplifier is a digital amplifier that converts an audio signal input in analog form into a digital signal, performs signal processing, such as noise elimination, or the like, on the digitally-converted audio signal, and amplifies the digitally-converted audio signal. The digitally-converted audio signal is amplified as a signal at a high voltage level. Here, the amplification operation is performed by a switching amplifier. Power at a high voltage level and a low voltage level is supplied to the switching amplifier. The switching amplifier performs a switching operation according to digital signals input to the switching amplifier, thereby outputting an audio signal at a high voltage level and an audio signal at a low voltage level, respectively.

The digital amplifier has high amplification efficiency. However, sound of the output audio signal is hard rather than soft. For example, 'hard sound' corresponds to mechanical sound or sounds having monotonous tone, and 'soft sound' corresponds to harmonic sound or sounds having mellow tone. In addition, simple distortion of sound may occur due to harmonic components generated by the digital amplifier.

In addition, when the switching operation is performed by the switching amplifier, switching noise occurs. Furthermore, the switching noise causes a reduction in a signal to noise ratio (SNR) of the switching amplifier. Also, power noise, such as ripple, exists in the power supplied to the switching amplifier. The power noise also causes a reduction in the SNR. In addition, a switching loss that occurs during switching amplification and a delay of a falling and rising time of a switching driving signal cause non-linearity of the output audio signal.

Thus, a method and apparatus that may solve the problems relating to monotonous sound, a reduction in the SNR, and non-linearity needs to be provided.

SUMMARY

The present inventive concept provides a method and apparatus for outputting an audio signal that may improve sound quality of the audio signal.

The present inventive concept also provides a method and apparatus for outputting an audio signal that may realize sound which corresponds to a vacuum tube and may simultaneously perform a high speed switching amplification operation.

The present inventive concept also provides a method and apparatus for outputting an audio signal that may realize sound which corresponds to a vacuum tube and may simultaneously reduce noise and non-linearity that may occur during a switching amplification operation, thereby improving the sound quality of the audio signal.

According to an aspect of the present inventive concept, there is provided an apparatus for outputting an audio signal, the apparatus including: a modulation and amplification unit for pulse modulation and switching amplification of an input audio signal and generating an amplified signal which corresponds to the input audio signal; and a vacuum tube amplification unit which inputs a vacuum tube signal generated by attenuating the amplified signal and adding harmonics of a vacuum tube to the amplified signal, to the modulation and amplification unit.

The vacuum tube amplification unit may include a vacuum tube attenuator which generates the vacuum tube signal by applying both a predetermined negative gain value and second harmonics to the amplified signal.

The vacuum tube attenuator may include a vacuum tube amplifier that has the predetermined negative gain value, and negatively amplifies the amplified signal by applying the predetermined negative gain value and outputs the negative amplified signal.

The modulation and amplification unit may include: a pulse signal generating unit which receives the input audio signal and generates a modulated signal which corresponds to the input audio signal by pulse modulation; a driver which generates a driving signal which corresponds to the modulated signal and controls a switching amplifying operation, and a power switching amplification unit for outputting the amplified signal by performing the switching amplification operation in response to the driving signal.

The pulse signal generating unit may generate a corrected audio signal by subtracting the vacuum tube signal from the input audio signal and may generate the modulated signal by pulse modulation of the corrected audio signal.

The pulse signal generating unit may include a sigma delta modulator (SDM) for outputting the modulated signal by sigma delta modulating of the input audio signal.

The sigma delta modulator (SDM) may include: an adder for subtracting the vacuum tube signal from the input audio signal; a loop filter for receiving an output signal of the adder, integrating and outputting the output signal of the adder, and a quantization unit for quantizing an output signal of the loop filter and outputting the modulated signal.

The SDM may further include a high order 1-bit single-loop SDM.

The power switching amplification unit may include an amplifier that is turned on or off in response to the driving signal and may include at least one switching element for performing the switching amplification operation.

The at least one switching element may include at least one selected from the group consisting of a gallium nitride (GaN) transistor, a gallium arsenide (GaAs) transistor, and a silicon carbide (SiC) transistor.

The pulse signal generating unit may generate the modulated signal by pulse modulating the input audio signal in one channel by using a first carrier signal having a first frequency or a first sampling clock signal, and the driver may generate the driving signal by pulse modulating the modulated signal by using a second carrier signal having a second frequency or a second sampling clock signal.

A value of the second frequency may be equal to or greater than a value of the first frequency.

According to another aspect of the present inventive concept, there is provided an apparatus which outputs an audio signal, the apparatus including a vacuum tube amplification unit which generates a vacuum tube signal by adding harmonics of a vacuum tube to an input audio signal; a pulse signal generating unit which generates a modulated signal which corresponds to the vacuum tube signal and is pulse modulated; a driver for which generates a driving signal which corresponds to the modulated signal and controlling a switching amplification operation, and a power switching amplification unit for outputting an amplified signal by performed the switching amplification operation in response to the driving signal.

The apparatus may further include a feedback loop.

The feedback loop may include: an attenuator which attenuates the amplified signal by applying a predetermined negative gain value to the amplified signal; and an adder for transmitting a corrected audio signal generated by subtracting an output signal of the attenuator from the input audio signal, to the vacuum tube amplification unit.

According to another aspect of the present inventive concept, there is provided a method of outputting an audio signal, the method including pulse modulating and switching amplification an input audio signal and generating an amplified signal which corresponds to the input audio signal; and reflecting a vacuum tube signal generated by attenuating the amplified signal and adding harmonics of a vacuum tube to the amplified signal, on the input audio signal.

According to another aspect of the present inventive concept, there is provided a method of outputting an audio signal, the method including: generating a vacuum tube signal by adding harmonics of a vacuum tube to an input audio signal; generating a modulated signal which corresponds to the vacuum tube signal and is pulse modulated; generating a driving signal which corresponds to the modulated signal and controlling a switching amplification operation; and outputting an amplified signal by performing the switching amplification operation in response to the driving signal.

According to another aspect of the present inventive concept, there is provided an apparatus which outputs an audio signal, the apparatus including a modulator and amplifier which generates an amplified signal which corresponds to an input audio signal; and a vacuum tube amplifier which inputs a vacuum tube signal generated by attenuating the amplified signal and adding to the modulator and amplifier harmonics of the vacuum tube amplifier to the amplified signal. The vacuum tube amplifier may include a vacuum tube attenuator which generates the vacuum tube signal by applying a predetermined negative gain value to the amplified signal and adding second harmonics to the amplified signal.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF THE EXEMPLARY EMBODIMENTS

As used herein, the term "and/or" includes any and all combinations of one or more of the associated listed items. Expressions such as "at least one of," when preceding a list of elements, modify the entire list of elements and do not modify the individual elements of the list.

The present inventive concept will now be described more fully with reference to the accompanying drawings, in which exemplary embodiments of the inventive concept are shown.

An analog amplifier may be an A-grade analog amplifier, a Class B analog amplifier, or an Class AB analog amplifier. The Class A-, B-, and AB analog amplifiers each use a transistor or a vacuum tube as their respective output unit, and linearity of an output audio signal is guaranteed. The analog amplifiers have excellent linearity but the power use efficiency is much lower than with digital amplifiers. In addition, due to the low power use efficiency, heat may be dissipated from the analog amplifier. As a result, aging characteristics of the analog amplifier are adversely affected. Furthermore, due to the low power use efficiency, sizes of internal elements of the analog amplifier may be increased to attain a high output, and the size of the analog amplifier may be increased.

However, the analog amplifier has good linearity of an output audio signal and may achieve sufficient sound from the vacuum tube.

Hereinafter, a method and apparatus for outputting an audio signal will be described in detail, whereby a digital amplifier is implemented using a vacuum tube to improve linearity of the audio signal and to achieve sufficient sound by removing drawbacks of the digital amplifier.

Figure 1:
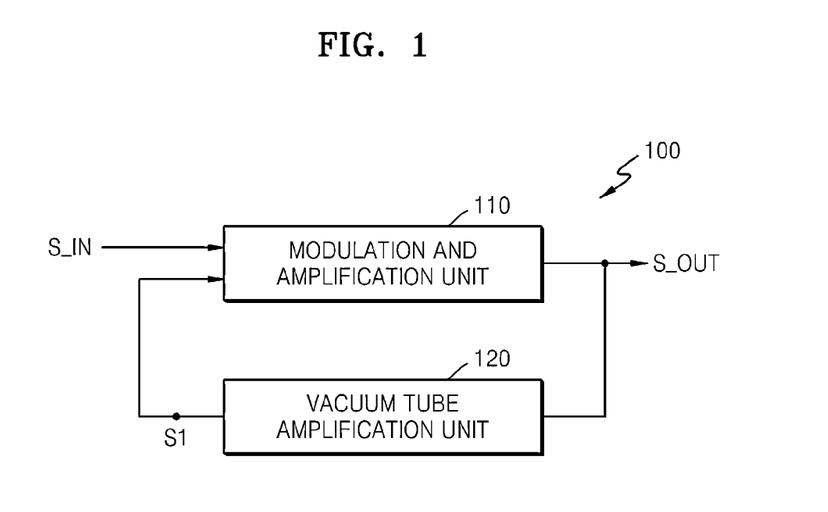
FIG. 1 is a block diagram showing an apparatus for outputting an audio signal according to an exemplary embodiment.

FIG. 1 is a block diagram showing an apparatus 100 for outputting an audio signal according to an exemplary embodiment.

Referring to FIG. 1, the apparatus 100 for outputting an audio signal according to the present exemplary embodiment may include a modification and amplification unit 110, and a vacuum tube amplification unit 120.

The modification and amplification unit 110 may pulse-modulate and switching-amplify an input audio signal S_IN to generate an amplified signal S_OUT which corresponds to the input audio signal S_IN.

The vacuum tube amplification unit 120 may attenuate the amplified signal S_OUT and may input a vacuum tube signal S1 to the modification and amplification unit 110. The vacuum tube signal S1 is generated by adding second harmonics of a vacuum tube to the amplified signal S_OUT to the modification and amplification unit 110.

The second harmonics of the vacuum tube are signal components generated when a predetermined signal passes through a vacuum tube element, i.e., the vacuum tube amplification unit 120. The second harmonics of the vacuum tube refer to second harmonics having a frequency that is an even-numbered multiple of a frequency of the predetermined signal input to the vacuum tube element. The second harmonics make the overall sound harmonic and mellow tone by reinforcing the predetermined signal. Thus, the vacuum tube signal S1 includes original frequency signal components of the amplified signal S_OUT and second harmonics which correspond to the original frequency signal components. The above-described second harmonics will be described below in detail, with reference to FIG. 5.

Figure 2:
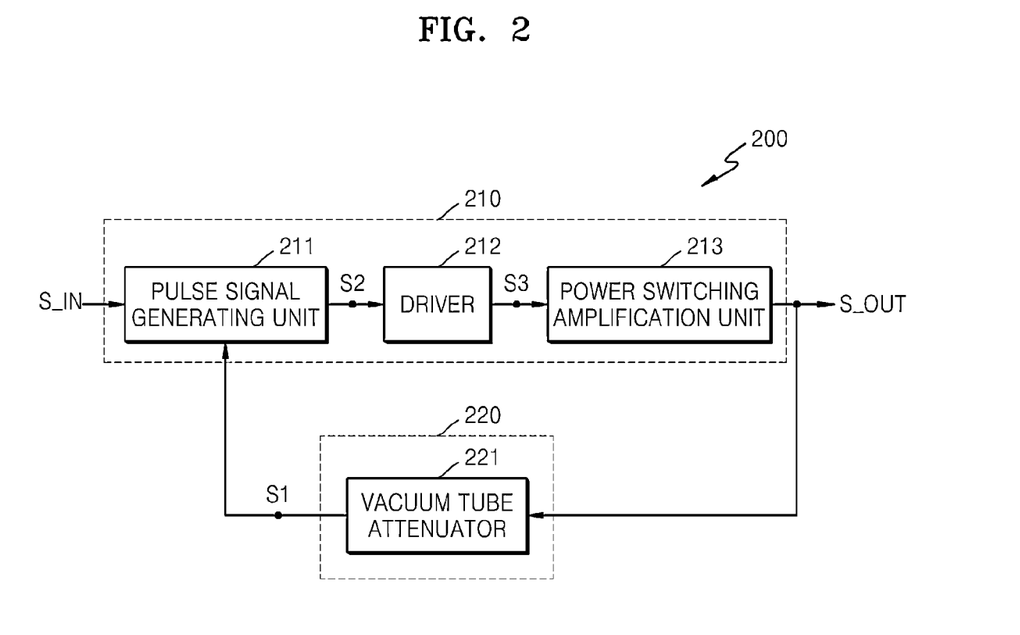
FIG. 2 is a block diagram showing an apparatus for outputting an audio signal according to another exemplary embodiment.

FIG. 2 is a block diagram showing an apparatus 200 for outputting an audio signal according to another exemplary embodiment.

Referring to FIG. 2, the apparatus 200 for outputting an audio signal includes a modification and amplification unit 210 and a vacuum tube amplification unit 220. Since the modification and amplification unit 210 and the vacuum tube amplification unit 220 of the apparatus 200 for outputting an audio signal illustrated in FIG. 2 correspond to the modification and amplification unit 110 and the vacuum tube amplification unit 120 illustrated in FIG. 1, respectively, a redundant description thereof will be omitted.

The modification and amplification unit 210 includes a pulse signal generating unit 211, a driver 212, and a power switching amplification unit 213.

An input audio signal S_IN is input to the pulse signal generating unit 211, and the pulse signal generating unit 211 generates a modified signal S2 that corresponds to the input audio signal S_IN and is pulse modulated.

In particular, the pulse signal generating unit 211 generates a corrected audio signal (not shown) by subtracting a vacuum tube signal S1 from the input audio signal S_IN and generates the modified signal S2 by pulse modulating the corrected audio signal (not shown).

For example, the pulse signal generating unit 211 may include a pulse width modulation (PWM) unit (not shown) or a pulse density modulation (PDM) unit (not shown).

For example, when the pulse signal generating unit 211 includes a PWM unit (not shown), the pulse signal generating unit 211 generates a pulse width-modulated signal as the modulated signal S2 by pulse width modulating the input audio signal S_IN.

In particular, the PWM unit (not shown) compares a first carrier signal that is a carrier signal having a predetermined frequency with the input audio signal S_IN that is an analog signal. In addition, the PWM unit (not shown) generates a pulse width-modulated signal corresponding to the input audio signal S_IN as the modulated signal S2 according to the comparison result. For example, by comparing a level of the carrier signal with a level of the input audio signal S_IN, the PWM unit (not shown) may generate the modulated signal S2 at a logic high level in a section in which the level of the input audio signal S_IN is higher than the level of the carrier signal and may generate the modulated signal S2 at a logic low level in a section in which the level of the input audio signal S_IN is lower than the level of the carrier signal.

As another example, when the pulse signal generating unit 211 includes a PDM unit (not shown), the pulse signal generating unit 211 generates a pulse density-modulated signal as the modulated signal S2 by pulse density modulating the input audio signal S_IN by using a first sampling clock signal that is a sampling clock signal having a predetermined frequency. For example, the PDM unit (not shown) may include a sigma delta modulator (SDM).

Hereinafter, a frequency of a first carrier signal and a first sampling clock signal used in the pulse signal generating unit 211 is referred to as a first frequency.

The driver 212 generates a driving signal S3 which corresponds to the modulated signal S2, and the driving signal S3 is used to control a switching amplification operation.

The power switching amplification unit 213 generates an amplified signal S_OUT by performing the switching amplification operation in response to the driving signal S3.

The vacuum tube amplification unit 220 may include a vacuum tube attenuator 221 that generates the vacuum tube signal S1 by applying a predetermined negative gain value to the amplified signal S_OUT and by adding second harmonics to the amplified signal S_OUT.

In particular, since the amplified signal S_OUT as an output signal of the power switching amplification unit 213 is a signal with a high voltage, when the amplified signal S_OUT is input to the pulse signal generating unit 211 without any change in the amplified signal S_OUT, oscillation may occur due to a high input voltage. Thus, the vacuum tube attenuator 221 decreases a voltage level of the amplified signal S_OUT according to the level of the input audio signal S_IN so as to prevent this oscillation.

The vacuum tube signal S1 output after passing through the power switching amplification unit 213 includes vacuum tube components and has an attenuated amplitude.

In particular, the vacuum tube attenuator 221 may be configured as a vacuum tube amplifier that has a predetermined negative gain value, and negatively amplifies the amplified signal S_OUT by applying the predetermined negative gain value and outputs the amplified signal S_OUT. Here, the predetermined negative gain value may be optimized and set according to a rating output, a specification, or the like, of the apparatus 200 for outputting an audio signal. The setting may be adjusted by the apparatus 200 for outputting an audio signal or by a user. For example, the predetermined negative gain value may be set as a gain value obtained by decreasing the level of the amplified signal S_OUT according to the level of the input audio signal S_IN.

Figure 3:
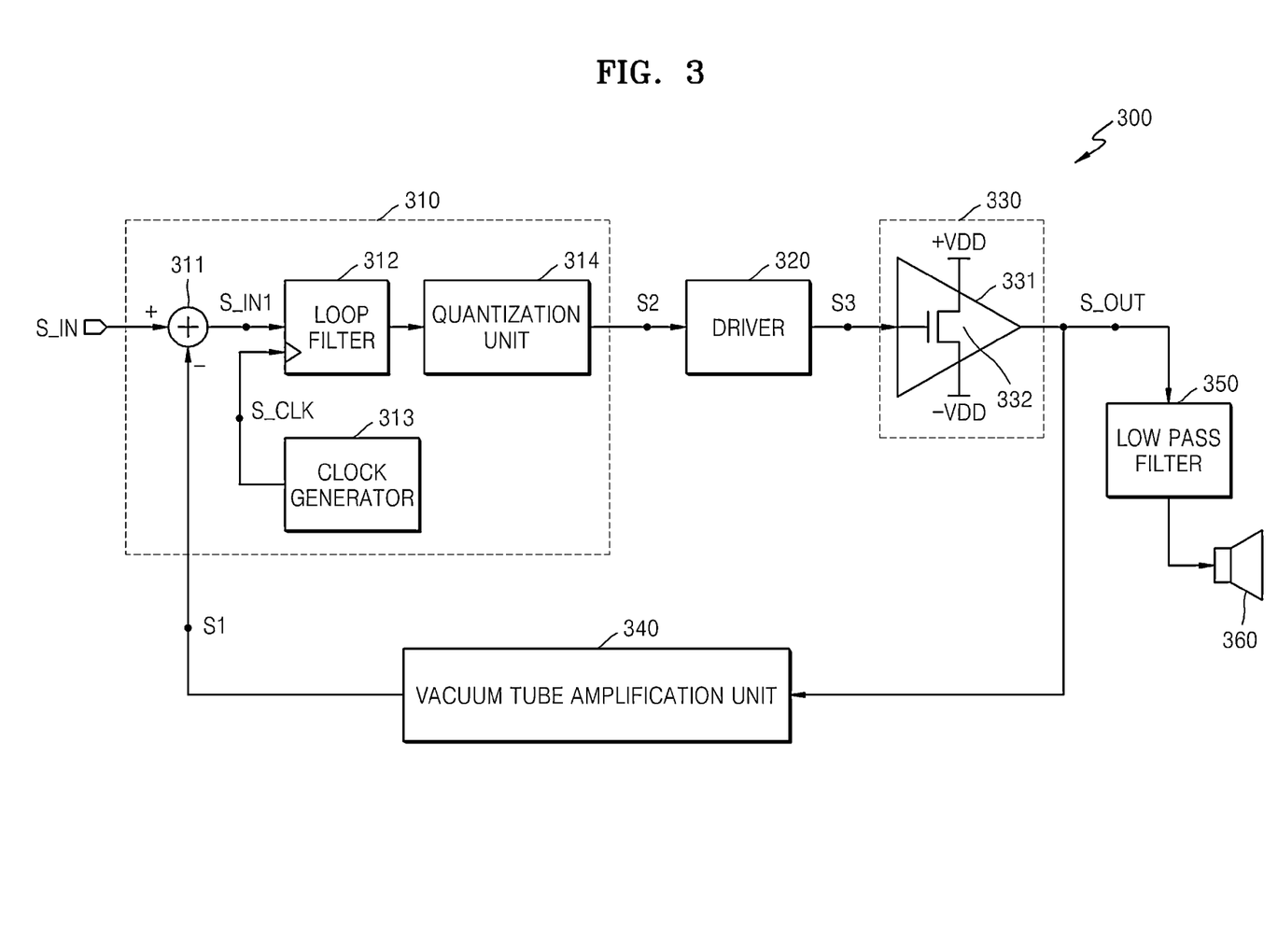
FIG. 3 is a block diagram showing an apparatus for outputting an audio signal according to another exemplary embodiment.

FIG. 3 is a block diagram showing an apparatus 300 for outputting an audio signal according to another exemplary embodiment. The apparatus 300 for outputting an audio signal in FIG. 3 illustrates the apparatus 200 for outputting an audio signal illustrated in FIG. 2 in more detail. Specifically, since a pulse signal generating unit 310, a driver 320, a power switching amplification unit 330, and a vacuum tube amplification unit 340 correspond to the pulse signal generating unit 211, the driver 212, the power switching amplification unit 213, and the vacuum tube amplification unit 220, respectively, a redundant description of FIG. 2 will be omitted. In addition, the apparatus 300 for outputting an audio signal may further include a low pass filter 350 and a speaker unit 360 unlike in the apparatus 200 for outputting an audio signal illustrated in FIG. 2.

In the apparatus 300 for outputting an audio signal, the pulse signal generating unit 310 includes a sigma delta modulator (SDM). Hereinafter, the pulse signal generating unit 310 is referred to as an SDM 310.

In particular, the SDM 310 outputs a modulated signal S2 by sigma delta modulating an input audio signal S_IN. In detail, the SDM 310 outputs the modulated signal S2 of which noise components are filtered, by performing a noise shaping operation whereby noise components included in the input audio signal S_IN are moved to an out-band other than an effective frequency band. The noise components may include switching noise that occurs during a switching amplification operation, noise included in supplied power, or the like.

In addition, the SDM 310 may include a high order 1-bit single-loop SDM. The high order 1-bit single-loop SDM moves the noise components included in the input audio signal S_IN further to an out-band other than the effective frequency band, resulting in high noise filtering performance.

The SDM 310 includes an adder 311, a loop filter 312, and a quantization unit 314. In addition, the SDM 310 may further include a clock generator 313.

The adder 311 subtracts a vacuum tube signal S1 from the input audio signal S_IN.

In particular, the vacuum tube signal S1 and the input audio signal S_IN are input to the adder 311. In addition, the adder 311 outputs a corrected audio signal S_IN1 by subtracting the vacuum tube signal S1 from the input audio signal S_IN. The corrected audio signal S_IN1 is generated by reflecting a value of the vacuum tube signal S1 on the input audio signal S_IN by using the adder 311 so that the SDM 310 may perform precise gain control according to a target gain or a maximum rating output of the apparatus 300 for outputting an audio signal.

In particular, the SDM 310 includes the adder 311, thereby adjusting at least one of a gain and a phase of the corrected audio signal S_IN1 input to the loop filter 312 of the SDM 310 in consideration of a gain and a phase of the amplified signal S_OUT. Thus, the SDM 310 may perform precise gain control according to the target gain or the maximum rating output of the apparatus 300 for outputting an audio signal.

The corrected audio signal S_IN1 as an output signal of the adder 311 is input to the loop filter 312, and the loop filter 312 integrates and outputs the input corrected audio signal S_IN1.

In particular, the loop filter 312 includes at least one integrator (not shown) which integrates the corrected audio signal S_IN1 by using the at least one integrator (not shown). In addition, the loop filter 312 shapes noise included in the corrected audio signal S_IN1 towards an external frequency band according to a predetermined noise transfer function (NTF).

The signal output from the loop filter 312 is input to the quantization unit 314, and the quantization unit 314 quantizes the input signal and generates a modulated signal S2 in a pulse signal form.

The clock generator 313 generates a clock signal S_CLK for setting a sampling period of the loop filter 312 to supply the clock signal S_CLK having a first frequency to the loop filter 312. Thus, the loop filter 312 performs an integrating operation by using the clock signal S_CLK having the first frequency as a sampling clock signal.

As described above, the apparatus 300 for outputting an audio signal illustrated in FIG. 3 performs the noise shaping operation by including the SDM 310 as the pulse signal generating unit 310, thereby filtering noise components including quantization noise that occurs in the apparatus 300 for outputting an audio signal, power noise, and power switching noise, or the like and filtering noise components included in the input audio signal S_IN.

In addition, the modulated signal S2 is input to the driver 320. The driver 320 may generate at least one driving signal S3 for controlling the switching amplifying operation according to the modulated signal S2 as the input signal. The switching amplification operation is performed using at least one switching element 332 disposed in the power switching amplification unit 330. The driving signal S3 is a switching control signal for controlling turn on or off of the switching element 332.

In particular, the driver 320 may include a pulse modulation unit (not shown) that outputs a pulse-form signal for turning on or off of the switching element 332.

When the driver 320 is configured as the pulse modulation unit (not shown), as described in relation to the pulse signal generating unit 211 of FIG. 2, the pulse modulation unit (not shown) as the driver 320 may include a PWM unit (not shown) or a PDM unit (not shown). Thus, the driver 320 performs a pulse modulation operation by using a second sampling clock signal having a second frequency and a second carrier signal.

The power switching amplification unit 330 is turned on or off in response to the driving signal S3 and may include an amplifier 331 including at least one switching element 332 for performing the switching amplification operation. In FIG. 3, one switching element 332 is included in the amplifier 331.

A high power voltage +VDD and a low power voltage −VDD are supplied to the amplifier 331. The amplifier 331 outputs an amplified signal S_OUT that transits between the high power voltage +VDD and the low power voltage −VDD in response to the driving signal S3.

In detail, the switching element 332 included in the amplifier 331 includes at least one from among a gallium nitride (GaN) transistor, a gallium arsenide (GaAs) transistor, and a silicon carbide (SiC) transistor.

The GaN transistor and the GaAs transistor have a short propagation delay and may operate at high speed at a high voltage. Here, the propagation delay refers to a time when a control signal for turning on a transistor is input to a gate of the transistor and then a saturated voltage signal is output to a source terminal or a drain terminal as an output terminal of the transistor.

The higher the power voltage +VDD at a logic high level of the amplified signal S_OUT, the longer a propagation delay time required for rising from 0V to the high power voltage. Thus, in order to implement the apparatus 300 for outputting an audio signal that attains a high output, a power switching operation needs to be performed at high speed, and the amplified signal S_OUT needs to be transited from 0V to the high power voltage +VDD.

When the GaN transistor or the GaAs transistor is used as the switching element 332 for performing the power switching operation, the power switching operation may be performed at high speed.

In addition, as the power switching operation is performed at high speed, switching noise may be minimized, and a signal to noise ratio (SNR) of the apparatus 300 for outputting an audio signal may be increased.

In addition, the GaN transistor used as the switching element may be a GaN hetero junction field effect transistor (GaN HFET).

As described above, the driving signal S3 having a high frequency is necessary to drive the power switching amplification unit 330 at high speed. Thus, the second frequency may be equal to or greater than the first frequency.

The low pass filter 350 demodulates the amplified signal S_OUT output from the power switching amplification unit 330 into an analog audio signal and outputs the demodulated signal. That is, since the signal output from the power switching amplification unit 330 is a digital signal, the low pass filter 350 converts the digital signal into an analog signal and outputs the analog signal.

The speaker unit 360 converts the output signal of the low pass filter 350 into a physical vibration signal that may be recognized by a user's ear, and outputs the signal.

Figure 4A:
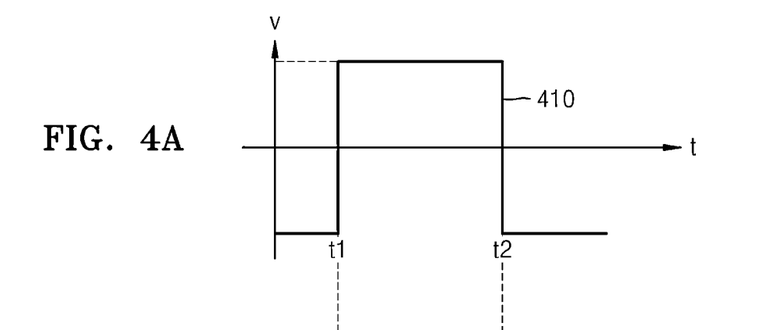
FIGS. 4A through 4C show signals to be input/output by the apparatus for outputting an audio signal illustrated in FIG. 3.
Figure 4B:
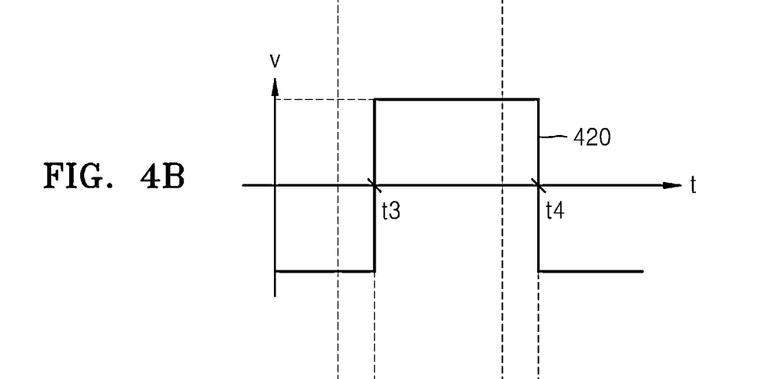
Figure 4C:
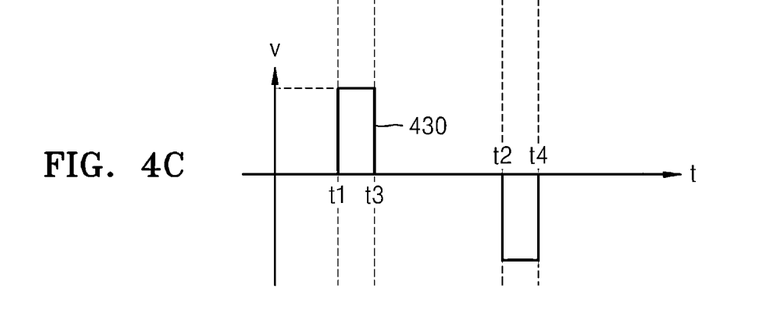

FIGS. 4A through 4C show signals to be input/output by the apparatus for outputting an audio signal illustrated in FIG. 3. In detail, FIG. 4A illustrates a signal waveform of the input audio signal S_IN, FIG. 4B illustrates a signal waveform of the vacuum tube signal S1 output from the vacuum tube amplification unit 340, and FIG. 4C illustrates the corrected audio signal S_IN1 output from the adder 311. In FIGS. 4A through 4C, the x-axis represents time, and the y-axis represents a voltage level that is a magnitude of a signal.

Referring to FIG. 4A, the input audio signal S_IN 410 is input as a signal at a logic high level from time t1 to time t2.

Referring to FIG. 4B, a predetermined time is required when the input audio signal S_IN 410 passes through the pulse signal generating unit 310, the driver 320, and the power switching amplification unit 330. Thus, the vacuum tube signal S1 420 is compared with the input audio signal S_IN 410 and has a delay time which corresponds to a time (t3-t1).

Referring to FIG. 4C, the corrected audio signal S_IN1 430 is output by subtracting the vacuum tube signal S1 420 from the input audio signal S_IN 410.

The loop filter 312 integrates and outputs the corrected audio signal S_IN1 430, thereby adjusting a phase and an amplitude of the amplified signal S_OUT that is actually output from the power switching amplification unit 330 to be the same as a target phase and a target amplitude of the amplified signal S_OUT.

Figure 5:
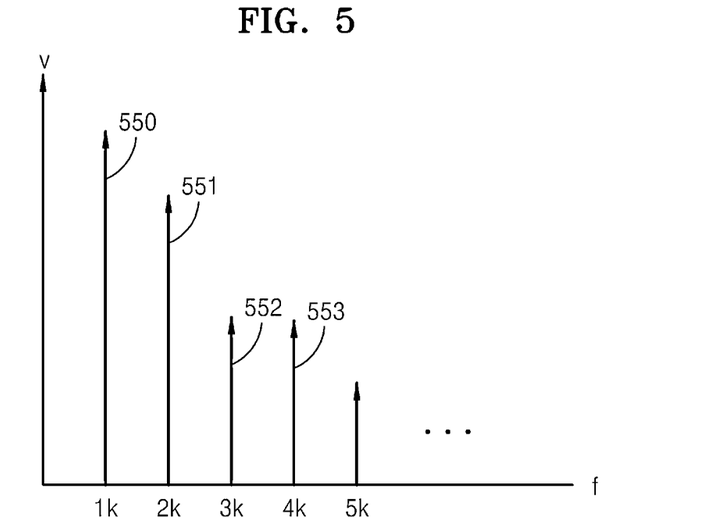
FIG. 5 is a graph showing components of a signal output by a vacuum tube amplification unit illustrated in FIG. 1.

FIG. 5 is a graph showing components of a signal output by a vacuum tube amplification unit 340 illustrated in FIG. 1. In FIG. 5, the x-axis represents a frequency, and the y-axis represents an amplitude of a signal.

Referring to FIG. 5, an audio signal output by the vacuum tube amplification unit 340 includes a plurality of signal components 550, 551, 552, and 553. The signal component 550 represents an audio signal component having a basic frequency 1 k as a main frequency of the amplified signal S_OUT. Graphs 551 and 553 represent audio signal components corresponding to second harmonics that are vacuum tube components generated when the audio signal passes through the vacuum tube amplification unit 340. Graph 552 represents third harmonics. Here, the third harmonics refer to signal components having a frequency that is an odd-numbered multiple of the basic frequency 1 k.

The second harmonics make the overall sound having mellow tone by reinforcing a target audio signal as a basic sound, as described above. In addition, a natural sense of sound may be attained, and a delicate change in sound may be expressed, and a mellow sound that may be heard over a wide area may be attained.

In contrast, the third harmonics have monotonous tone or mechanical sound and are recognized as simple noise. Thus, the third harmonics cause simple distortion of the basic sound.

The vacuum tube signal S1 including the signal components illustrated in FIG. 5 is input to the pulse signal generating unit 310 and is pulse modulated. Thus, the finally-output amplified signal S_OUT and output signals of the low pass filter 350 and the speaker unit 360 include vacuum tube components. Thus, the apparatus 100, 200, or 300 for outputting an audio signal illustrated in FIG. 1, 2, or 3 may output an audio signal with a mellow sound.

Figure 6A:
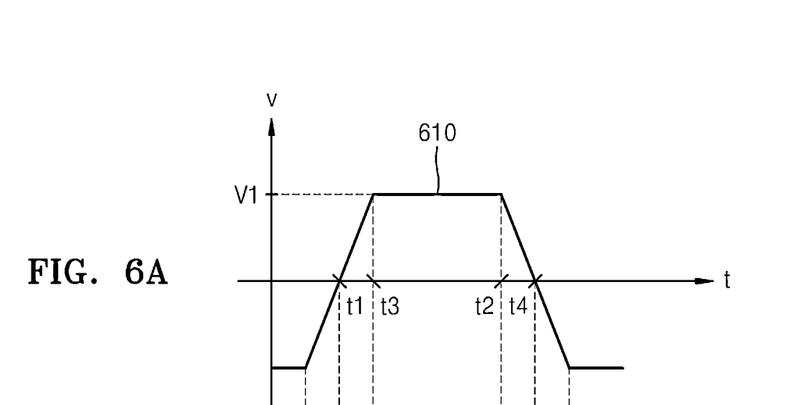
FIGS. 6A and 6B show signals to be output by the apparatus illustrated in FIG. 1.
Figure 6B:
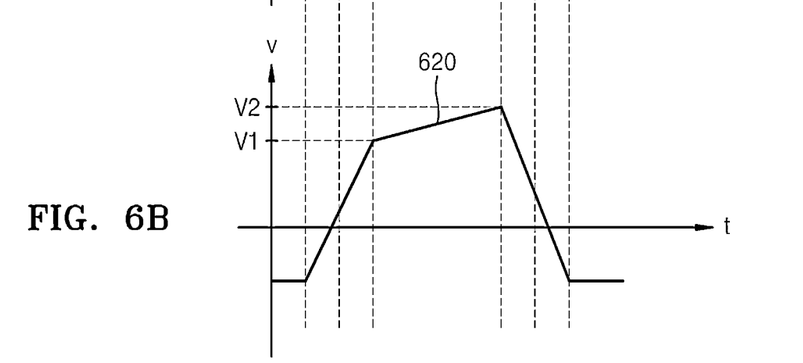

FIGS. 6A and 6B show signals to be output by the apparatus illustrated in FIG. 1. FIG. 6A represents an amplified signal S_OUT 610 that does not include second harmonics as vacuum tube components. FIG. 6B represents an amplified signal S_OUT 620 that includes second harmonics as the vacuum tube components. Since t1, t2, t3, and t4 illustrated in FIGS. 6A and 6B correspond to t1, t2, t3, and t4 illustrated in FIGS. 4A, 4B, and 4C, respectively, a redundant description of FIG. 4 will be omitted.

Referring to FIGS. 6A and 6B, in the case of the amplified signal S_OUT 620 that includes second harmonics as the vacuum tube components compared to the amplified signal S_OUT 610 that does not include second harmonics as the vacuum tube components, the logic high level of the amplified signal S_OUT 620 may be increased from V1 to V2 due to the vacuum tube components.

Figure 7:
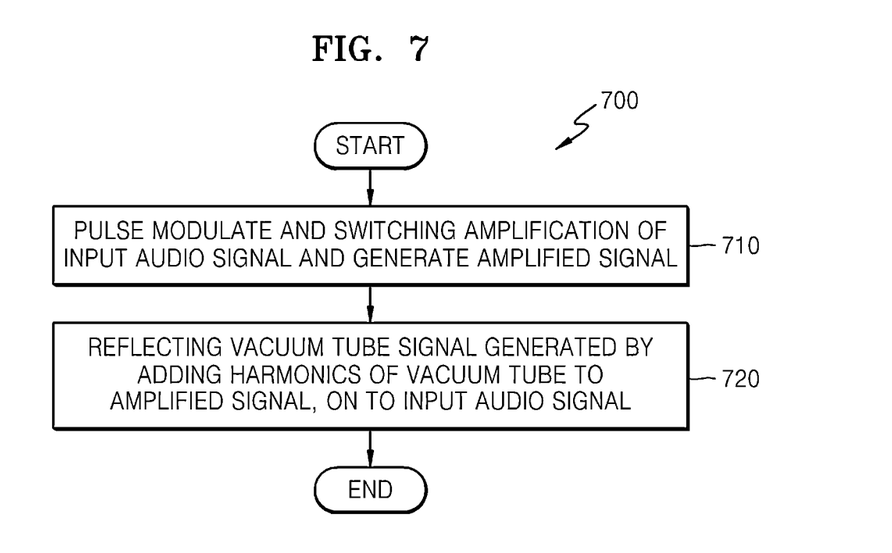
FIG. 7 is a flowchart illustrating a signal processing method according to an exemplary embodiment.

FIG. 7 is a flowchart illustrating a signal processing method 700 according to an exemplary embodiment. The signal processing method 700 illustrated in FIG. 7 may be performed by the apparatus 100, 200, or 300 for outputting an audio signal illustrated in FIG. 1, 2, or 3. Hereinafter, the signal processing method 700 according to the present exemplary embodiment will be described with reference to FIGS. 3 and 7.

Referring to FIG. 7, the signal processing method 700 according to the present embodiment includes pulse modulation and switching amplification of the input audio signal S_IN and generating the amplified signal S_OUT which corresponds to the input audio signal S_IN in operation 710. Operation 710 is performed by the modulation and amplification unit 110 of FIG. 1. In addition, operation 710 may be performed by the pulse signal generating unit 310, the driver 320, and the power switching amplification unit 330 of FIG. 3 that correspond to the modulation and amplification unit 110 of FIG. 1.

The signal processing method 700 further includes reflecting a vacuum tube signal that is generated by attenuating the amplified signal S_OUT generated in operation 710 and by adding harmonics of a vacuum tube to the amplified signal S_OUT, on to the input audio signal S_IN in operation 720. In particular, operation 720 may include generating (not shown) the vacuum tube signal S1 by applying a predetermined negative gain value to the amplified signal S_OUT and by adding second harmonics to the amplified signal S_OUT and subtracting (not shown) the vacuum tube signal S1 from the input audio signal S_IN. Here, the generating of the vacuum tube signal S1 may be performed by the vacuum tube amplification unit 340. The subtracting of the vacuum tube signal S1 from the input audio signal S_IN may be performed by the adder 311.

The signal processing method 700 illustrated in FIG. 7 includes the same technical spirit as the operation configuration of the apparatus 100, 200, or 300 for outputting an audio signal illustrated in FIG. 1, 2, or 3, as described in detail with reference to FIGS. 1 through 6. Thus, a redundant description of FIGS. 1 through 6 will be omitted.

Figure 8:
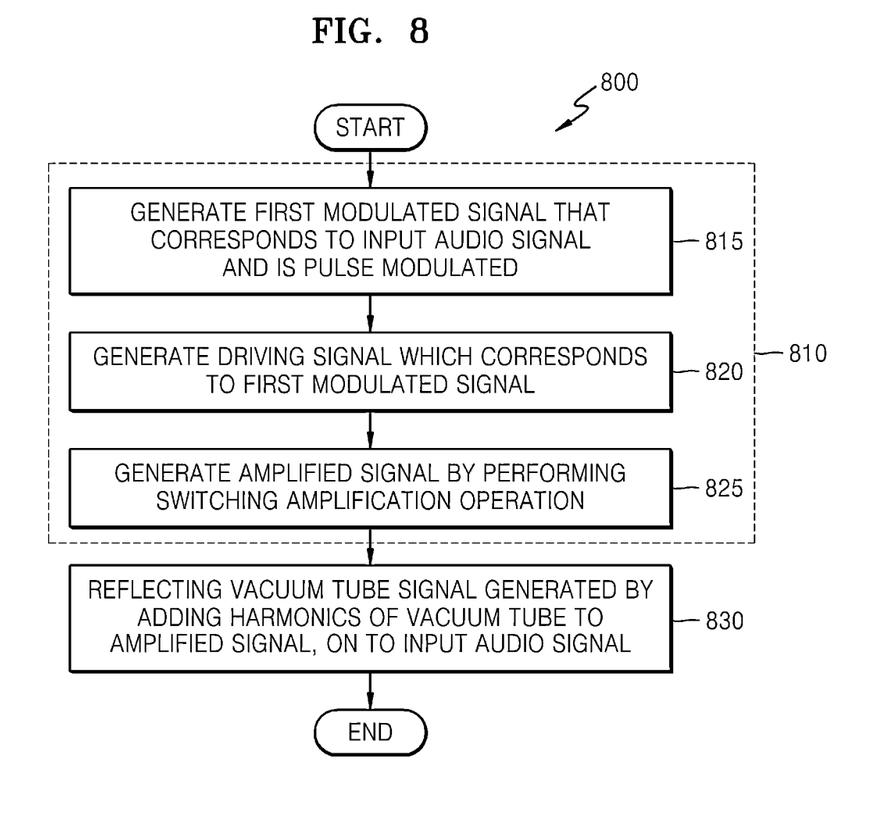
FIG. 8 is a flowchart illustrating a signal processing method according to another exemplary embodiment.

FIG. 8 is a flowchart illustrating a signal processing method 800 according to another embodiment of the present inventive concept. Since operations 810 and 830 of FIG. 8 correspond to operations 710 and 720 of FIG. 7, respectively, a redundant description of FIG. 7 will be omitted. The signal processing method 800 according to the present exemplary embodiment will be described with reference to FIGS. 3 and 8.

Referring to FIG. 8, the modulated signal S2 that corresponds to the input audio signal S_IN and is pulse modulated, is generated in operation 815. In particular, operation 815 may include generating the modulated signal S by sigma delta modulation (SMD) of the corrected audio signal S_IN1 that is obtained by subtracting the vacuum tube signal S1 from the input audio signal S_IN. Operation 815 is performed by the pulse signal generating unit 310.

The driving signal S3 which corresponds to the modulated signal S2 generated in operation 815 and used to control a switching amplification operation is generated in operation 820. Operation 820 is performed by the driver 320.

The amplified signal S_OUT is output by performing the switching amplifying operation in response to the driving signal S3 in operation 825. Operation 825 includes performing (not shown) the switching amplification operation by using at least one switching element that is turned on or off in response to the driving signal S3, and generating and outputting the amplified signal S_OUT through the switching amplification operation. Here, the switching element may include at least one of a GaN transistor, a GaAs transistor, and a SiC transistor. Operation 825 is performed by the power switching amplification unit 330.

The signal processing method 800 illustrated in FIG. 8 includes the same technical spirit as the operation configuration of the apparatus 200 or 300 for outputting an audio signal illustrated in FIG. 2 or 3, as described in detail with reference to FIGS. 1 through 6. Thus, a redundant description of FIGS. 1 through 6 will be omitted. The signal processing method 700 further includes reflecting a vacuum tube signal that is generated by attenuating the amplified signal S_OUT generated in operation 710 and by adding harmonics of the vacuum tube to the amplified signal S_OUT, on to the input audio signal S_IN in operation 720.

Figure 9:
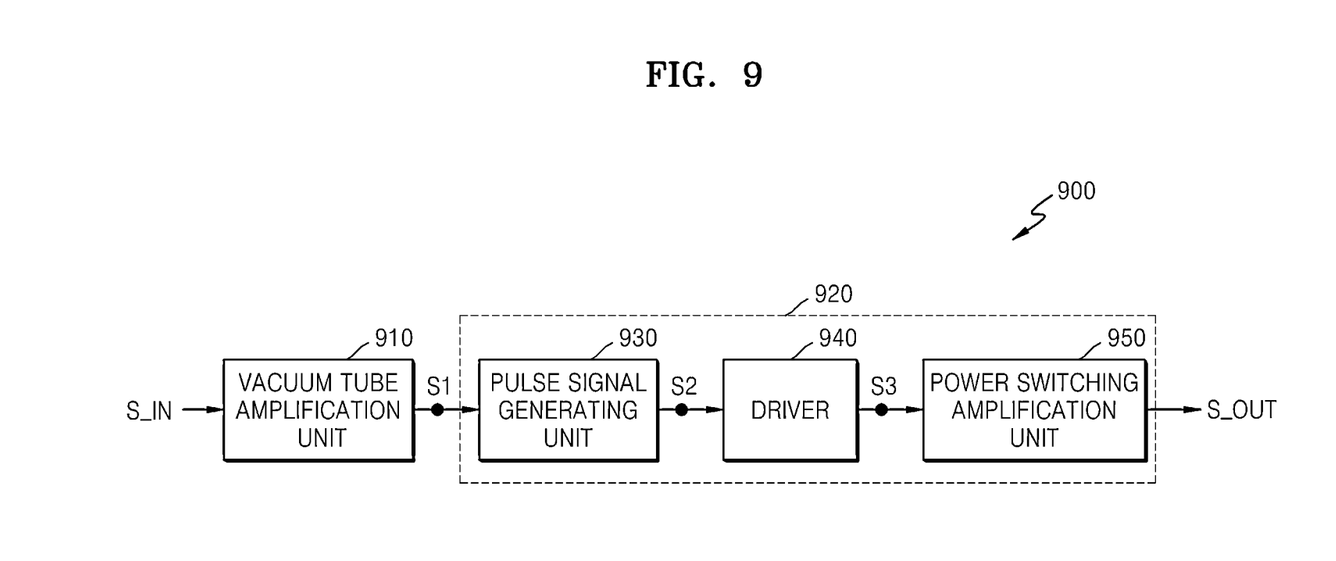
FIG. 9 is a block diagram showing an apparatus for outputting an audio signal according to another exemplary embodiment.

FIG. 9 is a block diagram showing an apparatus 900 for outputting an audio signal according to another exemplary embodiment.

Referring to FIG. 9, the apparatus 900 for outputting an audio signal according to the present exemplary embodiment includes a vacuum tube amplification unit 910, a pulse signal generating unit 930, a driver 940, and a power switching amplification unit 950. Here, a block configuration including the pulse signal generating unit 930, the driver 940, and the power switching amplification unit 950, corresponds to the modulation and amplification unit 110 of FIG. 1.

The vacuum tube amplification unit 910 generates a vacuum tube signal S1 by adding harmonics of a vacuum tube to an input audio signal S_IN. The vacuum tube amplification unit 910 is the same vacuum tube amplification unit 120, 220, or 340 illustrated in FIG. 1, 2, or 3 except that the vacuum tube amplification unit 910 is disposed at a front end of the pulse signal generating unit 930 and a negative gain is not applied to the input signal. Thus, a detailed description of the vacuum tube amplification unit 910 will be omitted.

The pulse signal generating unit 930 generates a modulated signal S2 that corresponds to the vacuum tube signal s1 and is pulse modulated. Since the pulse signal generating unit 930 is the same as the pulse signal generating unit 211 or 310 illustrated in FIG. 2 or 3, a detailed description of the pulse signal generating unit 930 will be omitted.

The driver 940 generates a driving signal S3 which corresponds to the modulated signal S2 transmitted by the pulse signal generating unit 930, and the driving signal S3 is used to control a switching amplifying operation. Since the driver 940 is the same as the above-described driver 212 or 320, a detailed description of the driver 940 will be omitted.

The power switching amplification unit 950 outputs the amplified signal S_OUT by performing the switching amplification operation in response to the driving signal S3. Since the power switching amplification unit 950 is the same as the above-described power switching amplification unit 213 or 330, a detailed description of the power switching amplification unit 950 will be omitted.

Figure 10:
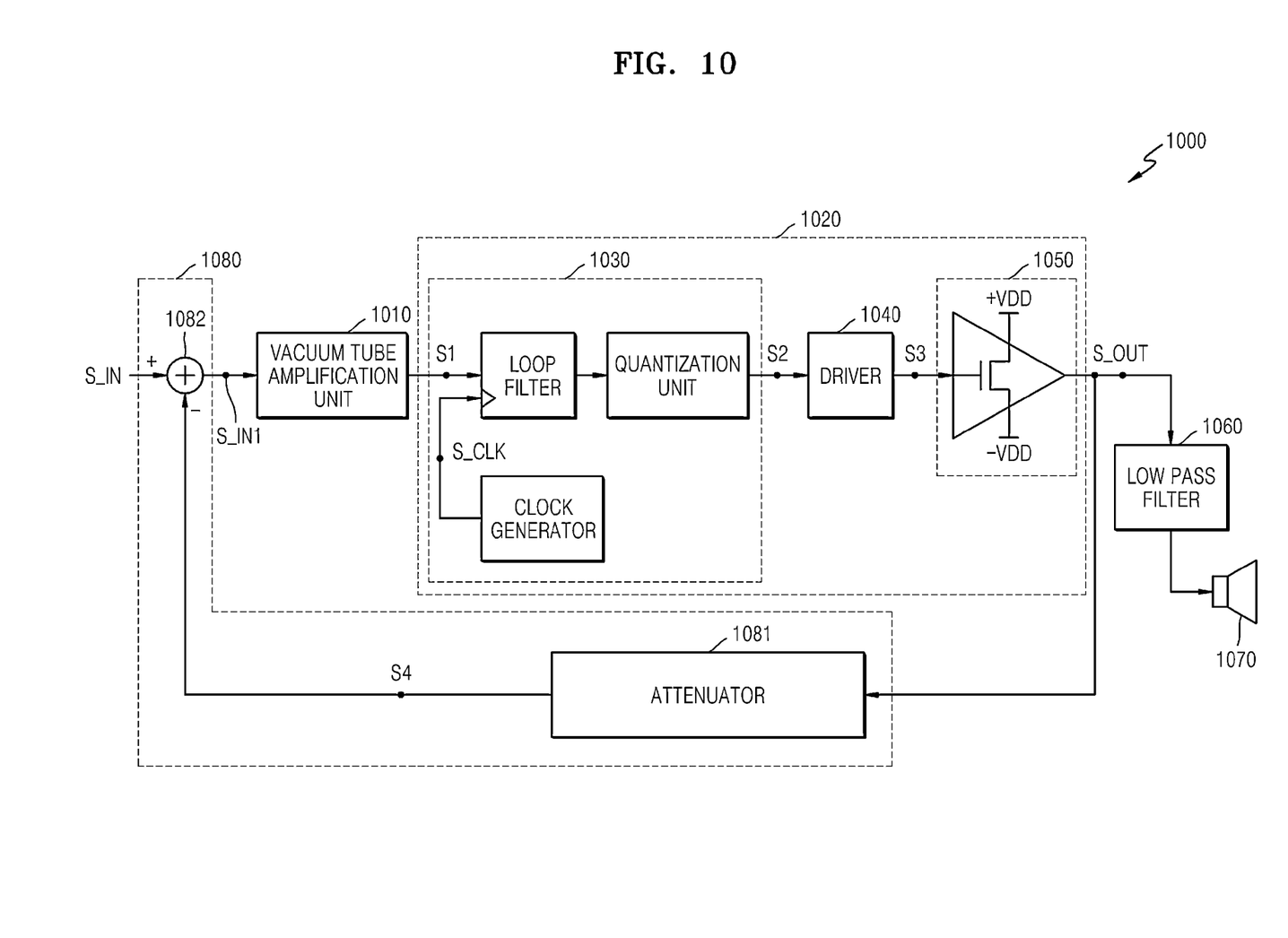
FIG. 10 is a block diagram showing an apparatus for outputting an audio signal according to another exemplary embodiment.

FIG. 10 is a block diagram showing an apparatus 1000 for outputting an audio signal according to another exemplary embodiment. The apparatus 1000 for outputting an audio signal illustrated in FIG. 10 illustrates the apparatus 900 for outputting an audio signal illustrated in FIG. 9 in more detail. Since a vacuum tube amplification unit 1010, a pulse signal generating unit 1030, a driver 1040, and a power switching amplification unit 1050 included in the apparatus 1000 for outputting an audio signal correspond to the vacuum tube amplification unit 910, the pulse signal generating unit 930, the driver 940, and the power switching amplification unit 950, respectively, a redundant description of FIG. 9 will be omitted.

Referring to FIG. 10, the vacuum tube amplification unit 1010 generates a vacuum tube signal S1 by adding harmonics of a vacuum tube to an input audio signal S_IN.

Since the pulse signal generating unit 1030, the driver 1040, and the power switching amplification unit 1050 correspond to the pulse signal generating unit 310, the driver 320, and the power switching amplification unit 330 described with reference to FIG. 3, respectively, a detailed description of the pulse signal generating unit 1030, the driver 1040, and the power switching amplification unit 1050 will be omitted.

The apparatus 1000 for outputting an audio signal may further include a feedback loop 1080. Here, the feedback loop 1080 includes an attenuator 1081 and an adder 1082.

The attenuator 1081 attenuates the amplified signal S_OUT by applying a predetermined negative gain value to the amplified signal S_OUT. In detail, the attenuator 1081 may attenuate the amplified signal S_OUT to be at the same as or at a similar level to a level of the input audio signal S_IN.

The adder 1082 inputs a corrected audio signal S_IN1 generated by subtracting an output signal S4 of the attenuator 1081 from the input audio signal S_IN, to the vacuum tube amplification unit 1010.

When the apparatus 1000 for outputting an audio signal further includes the feedback loop 1080, the vacuum tube amplification unit 1010 generates a vacuum tube signal S1 by adding harmonics of a vacuum tube to the corrected audio signal S_IN1.

In addition, the apparatus 1000 for outputting an audio signal may further include a low pass filter 1060 and a speaker unit 1070. Since the low pass filter 1060 and the speaker unit 1070 correspond to the low pass filter 350 and the speaker unit 360 of FIG. 3, respectively, a detailed description of the low pas filter 1060 and the speaker unit 1070 will be omitted.

Figure 11:
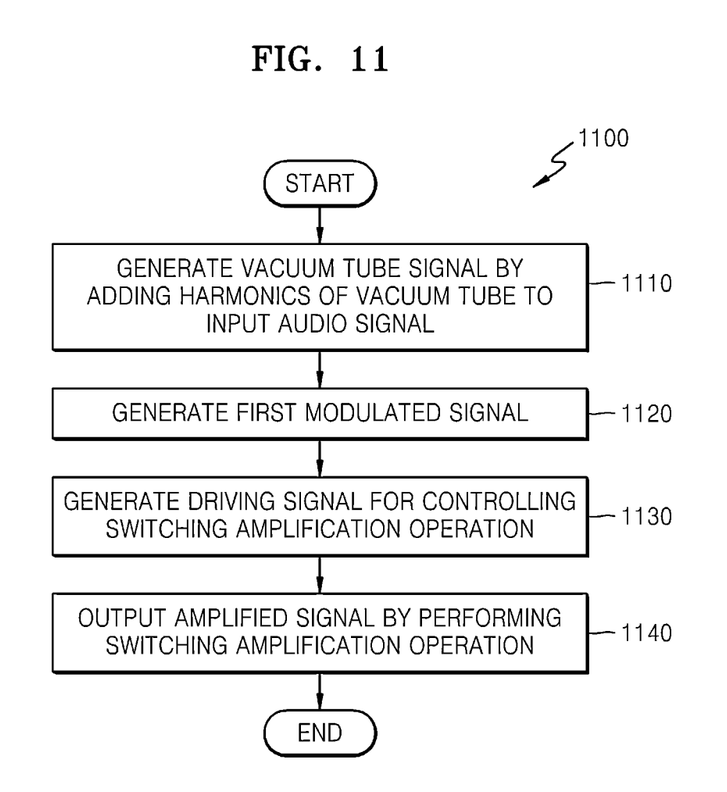
FIG. 11 is a flowchart illustrating a signal processing method according to another exemplary embodiment.

FIG. 11 is a flowchart illustrating a signal processing method 1100 according to another exemplary embodiment. The signal processing method 1100 of FIG. 11 may be performed by the apparatus 1000 for outputting an audio signal illustrated in FIG. 10. Hereinafter, the signal processing method 1100 according to the present exemplary embodiment will be described with reference to FIGS. 10 and 11.

Referring to FIG. 11, the vacuum tube signal S1 is generated by adding harmonics of the vacuum tube to the input audio signal S_IN in operation 1110. In addition, when the apparatus 1000 for outputting an audio signal further includes the feedback loop 1080, the vacuum tube signal S1 may be generated by adding the harmonics of the vacuum tube to the corrected audio signal S_IN1. Operation 1110 is performed by the vacuum tube amplification unit 1010.

The modulated signal S2 that corresponds to the vacuum tube signal S1 and is pulse modulated, is generated in operation 1120. Operation 1120 is performed by the pulse signal generating unit 1030.

The driving signal S3 which corresponds to the modulated signal S2 and used to control a switching amplification operation is generated in operation 1130. Operation 1130 may be performed by the driver 1040.

The amplified signal S_OUT is output by performing the switching amplification operation in response to the driving signal S3 in operation 1140. Operation 1140 is performed by the power switching amplification unit 1050.

The signal processing method 1100 illustrated in FIG. 11 includes the same technical spirit as the operation configuration of the apparatus 1000 for outputting an audio signal illustrated in FIG. 10. Thus, a redundant description of FIG. 10 will be omitted.

As described above, in the apparatus and method of outputting an audio signal according to the one or more exemplary embodiments, a pulse modulation operation is performed by mixing harmonics of a vacuum tube with an audio signal. Thus, an audio signal with a mellow sound which corresponds to the vacuum tube may be output. In addition, the sound quality of the output audio signal may be improved.

Furthermore, in the apparatus and method of outputting an audio signal according to the one or more exemplary embodiments, a switching amplification operation is performed according to a high frequency by using a power switching amplification unit including a switching element that may operate at high speed. Thus, switching noise may be minimized, and a signal to noise ratio (SNR) may be increased.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion.

While this invention has been particularly shown and described with reference to preferred exemplary embodiments thereof, it will be understood by those of ordinary skill in the art that various changes in form and details may be made therein without departing from the spirit and scope of the invention as defined by the appended claims. The preferred embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. An apparatus for outputting an audio signal, the apparatus comprising:
   a modulator and amplifier for pulse modulation and switching amplification of an input audio signal and generating an amplified signal which corresponds to the input audio signal; and
   a vacuum tube amplifier which inputs a vacuum tube signal generated by attenuating the amplified signal and adding the modulator and amplifier harmonics of a vacuum tube to the amplified signal.

2. The apparatus of claim 1, wherein the vacuum tube amplifier comprises a vacuum tube attenuator which generates the vacuum tube signal by applying a predetermined negative gain value to the amplified signal and adding second harmonics to the amplified signal.

3. The apparatus of claim 2, wherein the vacuum tube attenuator comprises a vacuum tube amplifier that has the predetermined negative gain value, and negatively amplifies the amplified signal by applying the predetermined negative gain value and outputs the negative amplified signal.

4. The apparatus of claim 1, wherein the modulator and amplifier comprises:
   a pulse signal generator which receives the input audio signal and generates a modulated signal which corresponds to the input audio signal by pulse modulation;
   a driver which generates a driving signal which corresponds to the modulated signal and controls a switching amplification operation; and
   a power switching amplifier for outputting the amplified signal by performing the switching amplification operation in response to the driving signal.

5. The apparatus of claim 4, wherein the pulse signal generator generates a corrected audio signal by subtracting the vacuum tube signal from the input audio signal and generates the modulated signal by pulse modulation of the corrected audio signal.

6. The apparatus of claim 5, wherein the pulse signal generator comprises a sigma delta modulator (SDM) for outputting the modulated signal by sigma delta modulating the input audio signal.

7. The apparatus of claim 6, wherein the sigma delta modulator (SDM) comprises:
   an adder which subtracts the vacuum tube signal from the input audio signal;
   a loop filter which receives and integrates an output signal of the adder, and outputs an integrated output signal of the adder; and
   a quantizer which quantizes an output signal of the loop filter and outputs the modulated signal.

8. The apparatus of claim 6, wherein the SDM further comprises a high order 1-bit single-loop SDM.

9. The apparatus of claim 4, wherein the power switching amplifier comprises an amplifier that is turned on or off in response to the driving signal and comprises at least one switching element for performing the switching amplification operation.

10. The apparatus of claim 9, wherein the at least one switching element in the amplifier comprises at least one switching element selected from the group consisting of a gallium nitride (GaN) transistor, a gallium arsenide (GaAs) transistor, and a silicon carbide (SiC) transistor.

11. The apparatus of claim 10, wherein the pulse signal generator generates the modulated signal by pulse modulation of the input audio signal in one channel by using a first carrier signal having a first frequency or a first sampling clock signal, and the driver generates the driving signal by pulse modulating the modulated signal by using a second carrier signal having a second frequency or a second sampling clock signal.

12. The apparatus of claim 11, wherein a value of the second frequency is equal to or greater than a value of the first frequency.

13. An apparatus for outputting an audio signal, the apparatus
   a vacuum tube amplifier which generates a vacuum tube signal by adding harmonics of a vacuum tube to an input audio signal;

a pulse signal generator which generates a modulated signal that corresponds to the vacuum tube signal and is pulse modulated;

a driver which generates a driving signal which corresponds to the modulated signal and controls a switching amplification operation; and a power switching amplifier which outputs an amplified signal by performing the switching amplification operation in response to the driving signal.

14. The apparatus of claim 13, further comprising a feedback loop, wherein the feedback loop comprises:

an attenuator which attenuates the amplified signal by applying a predetermined negative gain value to the amplified signal; and an adder which transmits, to the vacuum tube generator, a corrected audio signal generated by subtracting an output signal of the attenuator from the input audio signal, to the vacuum tube amplifier.

15. The apparatus of claim 14, wherein the vacuum tube amplifier generates the vacuum tube signal by adding harmonics of the vacuum tube to the corrected audio signal.

16. The apparatus of claim 15, wherein the pulse signal generator comprises:

a loop filter which receives and integrates an output signal of the adder, and outputs an integrated output signal of the adder; and a quantizer which quantizes an output signal of the loop filter and outputs the modulated signal.

17. A method of outputting an audio signal, the method comprising:

pulse modulating and switch amplifying an input audio signal and generating an amplified signal which corresponds to the input audio signal; and reflecting a vacuum tube signal, generated by a vacuum tube attenuating the amplified signal and adding harmonics of the vacuum tube to the amplified signal, on the input audio signal.

18. The method of claim 17, wherein the reflecting of the vacuum tube signal on the input audio signal comprises:

generating the vacuum tube signal by applying a predetermined negative gain value to the amplified signal and adding second harmonics to the amplified signal; and subtracting the vacuum tube signal from the input audio signal.

19. The method of claim 17, wherein the generating of the amplified signal comprises:

generating a modulated signal which corresponds to the input audio signal and is pulse modulated;

generating a driving signal which corresponds to the modulated signal and controlling a switching amplification operation; and outputting the amplified signal by performing the switching amplification operation in response to the driving signal.

20. The method of claim 17, wherein the generating of the modulated signal comprises generating the modulated signal by sigma delta modulation (SMD) of a corrected audio signal obtained by subtracting the vacuum tube signal from the input audio signal.

21. The method of claim 20, wherein the outputting of the amplified signal comprises:

performing a switching amplification operation by using at least one switching element that is turned on or off in response to the driving signal; and generating and outputting the amplified signal through the switching amplification operation, and the at least one switching element comprises at least one switching element selected from the group consisting of a gallium nitride (GaN) transistor, a gallium arsenide (GaAs) transistor, and a silicon carbide (SiC) transistor.

22. A method of outputting an audio signal, the method comprising:

generating a vacuum tube signal by adding harmonics of a vacuum tube to an input audio signal;

generating a modulated signal that corresponds to the vacuum tube signal;

generating a driving signal which corresponds to the modulated signal and controlling a switching amplification operation; and outputting an amplified signal by performing the switching amplification operation in response to the driving signal.

* * * * *